(12) United States Patent
Lin et al.

(10) Patent No.: US 9,941,356 B1
(45) Date of Patent: Apr. 10, 2018

(54) JFET AND METHOD FOR FABRICATING THE SAME

(71) Applicant: Vanguard International Semiconductor Corporation, Hsinchu (TW)

(72) Inventors: Wen-Hsin Lin, Jhubei (TW); Shin-Cheng Lin, Tainan (TW); Cheng-Tsung Wu, Taipei (TW); Yu-Hao Ho, Keelung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/492,805

(22) Filed: Apr. 20, 2017

(51) Int. Cl.
| | |
|---|---|
| H01L 29/80 | (2006.01) |
| H01L 31/112 | (2006.01) |
| H01L 29/10 | (2006.01) |
| H01L 29/808 | (2006.01) |
| H01L 29/66 | (2006.01) |
| H01L 21/265 | (2006.01) |
| H01L 21/324 | (2006.01) |
| H01L 21/225 | (2006.01) |

(52) U.S. Cl.
CPC ...... H01L 29/1058 (2013.01); H01L 21/2253 (2013.01); H01L 21/26513 (2013.01); H01L 21/324 (2013.01); H01L 29/66901 (2013.01); H01L 29/808 (2013.01)

(58) Field of Classification Search
CPC .......... H01L 29/1058; H01L 29/66901; H01L 29/808
USPC ......................................... 257/272, 279, 285
See application file for complete search history.

(56) References Cited

U.S. PATENT DOCUMENTS

| | | | | |
|---|---|---|---|---|
| 7,863,645 B2* | 1/2011 | Masliah | .............. | H01L 29/7832 257/129 |
| 2010/0271133 A1* | 10/2010 | Bracale | ............... | H01L 27/0617 330/277 |
| 2011/0156052 A1* | 6/2011 | Malhan | ............... | H01L 29/1066 257/77 |

FOREIGN PATENT DOCUMENTS

TW   201010075 A1   3/2010

* cited by examiner

Primary Examiner — Thien F Tran
(74) Attorney, Agent, or Firm — Birch, Stewart, Kolasch & Birch, LLP

(57) ABSTRACT

A junction field effect transistor includes a substrate and a gate region having a first conductive type in the substrate. Source/drain regions of a second conductive type opposite to the first conductive type are disposed in the substrate on opposite sides of the gate region. A pair of high-voltage well regions of the second conductive type are disposed beneath the source/drain regions. A channel region is provided beneath the gate region and between the pair of high-voltage well regions. The channel region is of the second conductive type and has a dopant concentration lower than that of the pair of high-voltage well regions.

6 Claims, 7 Drawing Sheets

JFET AND METHOD FOR FABRICATING THE SAME

BACKGROUND

Technical Field

The disclosure relates to a junction field effect transistor (JFET), and more particularly to a junction field effect transistor with a cut-off voltage which may be effectively modulated.

Description of the Related Art

Any integrated circuit needs a supply of electricity to operate, but the applied voltage may not completely meet the requirements for integrated circuit operation. Therefore, voltage conversion is needed. Conversion circuits used in voltage conversion need an activation device to adapt the electricity source to enable the conversion circuit to operate. The junction field effect transistor is a common active device used for this purpose.

The junction field effect transistor mainly changes the electric field near the channel by controlling a signal (e.g. the gate voltage), making a change to the channel characteristics resulting in a current change between source and drain. Therefore, the junction field effect transistor may be a variable resistor controlled by a voltage, or a voltage controlled current source (VCCS), etc. In JFET, the depletion width of the PN junction between the gate and the source/drain is the function of the reverse biased voltage, and the channel width may be changed by modifying the depletion width.

In a junction field effect transistor, when voltage is applied to the gate, the depletion region of the PN junction is enlarged, and the channel width is reduced. When the gate voltage is greater than the threshold voltage, the depletion region is widened, making the channel disappear. The channel is cut off and the value of the gate voltage is called the channel cut-off voltage.

In a conventional high-voltage process, the drain concentration and the substrate concentration are restricted due to the requirements of the breakdown voltage (BV). Therefore, it is necessary to modulate the channel cut-off voltage by modifying the gate structure. The shallower the gate structure, the higher the channel cut-off voltage. However, this method has its limitations. If the depth difference of the gate structure and the channel region is too great, the gate structure and the channel region are broken down before the channel is cut-off. It is possible that the cut-off voltage is higher than the endurable range of the high-voltage devices in the high-voltage process. However, if the channel concentration is reduced by lowering down the drain concentration, even though the channel cut-off voltage is reduced, the on-resistance (Ron) of the high-voltage device is traded off.

Therefore, although existing junction field effect transistors have generally been adequate for their intended purposes, they have not been entirely satisfactory in all respects.

BRIEF SUMMARY

The present disclosure provides a junction field effect transistor. The junction field effect transistor includes a substrate. The junction field effect transistor further includes a gate region disposed in the substrate and having a first conductive type. The junction field effect transistor further includes source/drain regions disposed in the substrate on opposite sides of the gate region and having a second conductive type opposite to the first conductive type. The junction field effect transistor further includes a pair of high-voltage well (HVW) regions disposed beneath the source/drain regions and having the second conductive type. The junction field effect transistor further includes a channel region, disposed beneath the gate region and between the pair of high-voltage well regions. The channel region has the second conductive type, and a dopant concentration of the channel region is lower than the dopant concentration of the pair of high-voltage well regions.

The present disclosure also provides a method for fabricating a junction field effect transistor. The method for fabricating a junction field effect transistor includes providing a substrate. The method for fabricating a junction field effect transistor further includes implanting the substrate to form a pair of high-voltage well (HVW) regions beneath source/drain predetermined regions. The pair of high-voltage well regions have a dopant of a first conductive type. The method for fabricating a junction field effect transistor further includes performing an annealing process on the substrate to diffuse the dopant of the high-voltage well regions, thereby forming a channel region between the pair of high-voltage well regions. The dopant concentration of the pair of high-voltage well regions is higher than a dopant concentration of the channel region. The method for fabricating a junction field effect transistor further includes forming a gate region above the channel region and having a second conductive type. The method for fabricating a junction field effect transistor further includes forming source/drain regions at the source/drain predetermined regions and having the first conductive type.

The present disclosure also provides a method for fabricating a junction field effect transistor. The method for fabricating a junction field effect transistor includes providing a substrate. The method for fabricating a junction field effect transistor further includes implanting the substrate to form a high-voltage well (HVW) region in the substrate and. The high-voltage well region has a first conductive type. The method for fabricating a junction field effect transistor further includes counter-doping a center portion of the high-voltage well region to form a channel region. The counter-doping uses a dopant of a second conductive type. The dopant concentration of the counter-doping is lower than a dopant concentration of the high-voltage well region. The method for fabricating a junction field effect transistor further includes forming a gate region above the channel region and having the second conductive type. The method for fabricating a junction field effect transistor further includes forming source/drain regions in the substrate on opposite sides of the gate region and having the first conductive type.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

Figure 1:
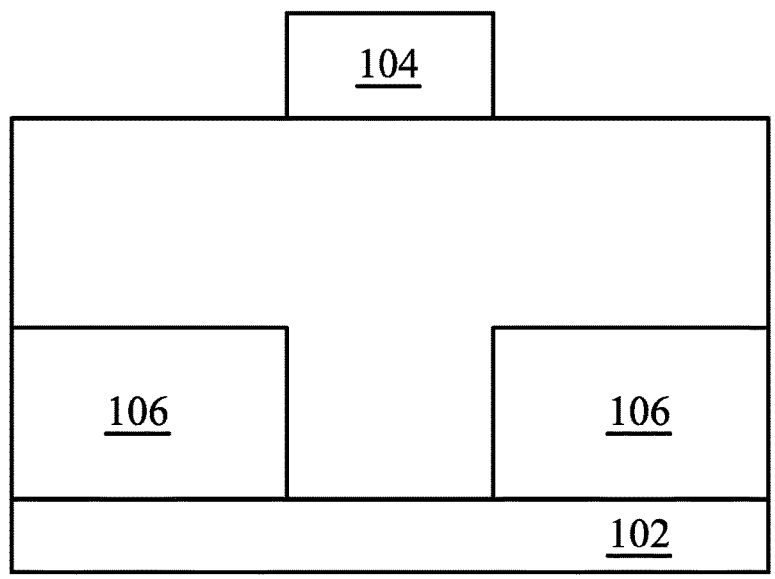
FIGS. 1-5 are cross-sectional representations of various stages of forming a junction field effect transistor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although N-type channel junction field effect transistors are used as examples in the following embodiments, those skilled in the art in this technical field should understand that the present disclosure may be applied to P-type channel junction field effect transistors as well.

The embodiments of the present disclosure provide a method to modulate the channel cut-off voltage of a junction field effect transistor effectively. The channel region of the junction field effect transistor is formed by thermal diffusing the N-type high-voltage well region. Since the N-type dopant concentration of the channel region is lower, it is easy to form a depletion region in the channel region, which may effectively reduce the channel cut-off voltage. The channel breakdown before being pinching-off may be prevented.

FIGS. 1 to 5 are cross-sectional representations of various stages of forming the junction field effect transistor 100 in accordance with some embodiments of the present disclosure. As shown in FIG. 1, a substrate 102 is provided. The substrate 102 may be a semiconductor substrate such as a silicon substrate. Moreover, the semiconductor substrate may also include elementary semiconductor including germanium; compound semiconductor including gallium nitride, silicon carbide, gallium arsenide, gallium phosphide, indium phosphide, indium arsenide, and/or indium antimonide; alloy semiconductor including SiGe, GaAsP, AlInAs, AlGaAs, GaInAs, GaInP, and/or GaInAsP, or a combination thereof. In addition, the substrate 102 may also be semiconductor on insulator (SOI). The substrate 102 may be N-type or P-type conductive type. In the embodiments of N-type channel junction field effect transistors, the substrate 102 may be a P-type substrate.

Next, the patterned photoresist 104 is formed on the substrate 102, and an implantation process is performed by using the photoresist 104 as a mask. An N-type dopant is implanted in the substrate 102 to form the pair of N-type high-voltage well regions 106. The N-type dopant may include P, As, N, Sb, or a combination thereof. The dopant concentration of the N-type high-voltage well region 106 is in a range of around $10^{14}/cm^3$ to $10^{16}/cm^3$, while the dopant energy is in a range of around 1000 keV to 3000 keV, and the dopant depth is in a range of around 1 µm to 2.5 µm. However, those skilled in the art in this technical field may understand that the above dopant concentration, energy, and depth may depend on specific device, technology node, and minimum device size. Therefore, the above dopant conditions are merely examples. Moreover, the patterned photoresist 104 may be replaced by a patterned hard mask such as SiN.

Figure 2:
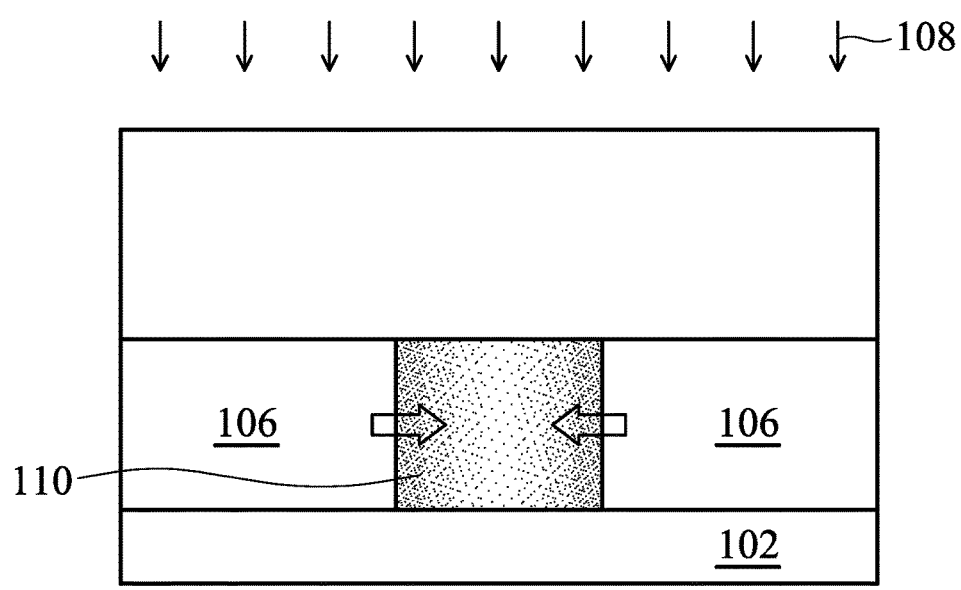

As shown in FIG. 2 according to some embodiments, after implanting the substrate to form the pair of N-type high-voltage well regions 106, a high-temperature annealing process 108 is performed to diffuse the dopant of the N-type high-voltage well region 106 and thereby forming the channel region 110. The arrows in the figure show the diffusion directions of the dopant. The channel region 110 is N-type, and the depth of the channel region 110 is substantially the same as that of the high-voltage well region 106. The dopant concentration of the channel region 110 is lower than the dopant concentration of the high-voltage well region 106, and it decreases as distance increases away from the pair of high-voltage well regions 106. After annealing, the dopant concentration of the channel region 110 is in a range of around $10^{14}/cm^3$ to $10^{15}/cm^3$.

The annealing process 108 may include rapid thermal annealing (RTA), laser annealing, furnace annealing, and/or flash lamp annealing. In the embodiments of the present disclosure, the annealing process is performed at a temperature in a range of 1100° C. to 1200° C. for in a range of 12 hours to 24 hours. The combination of the temperature and the time during the annealing process 108 is restricted by a thermal budget. If the temperature is too high or the time is too long, the dopant junction may extend and change the device's electrical characteristics. If the temperature is too low or the time is too short, the channel of the junction field effect transistor is not able to be formed at the channel region 110.

Figure 3:
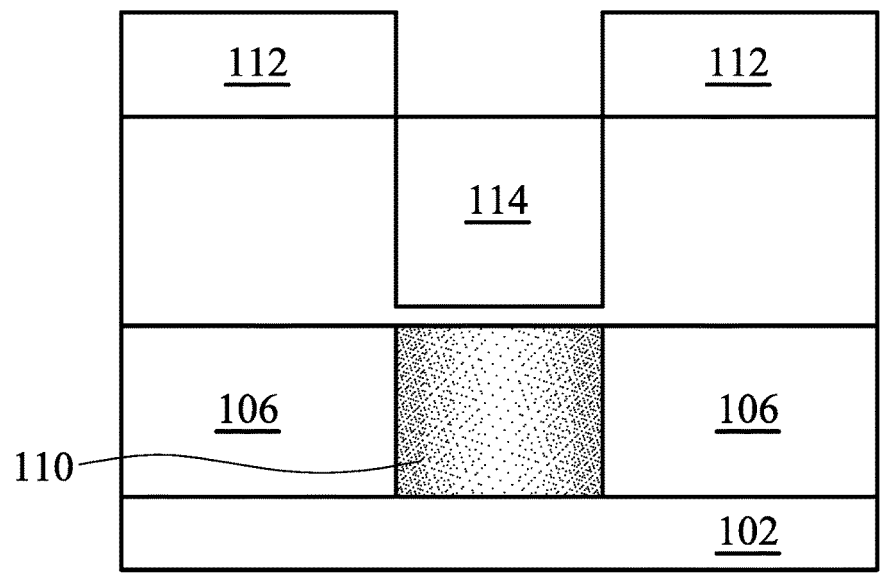

Next, as shown in FIG. 3 according to some embodiments, another patterned photoresist 112 is formed on the substrate 102, and an implantation process is performed by using the photoresist 112 as a mask. A P-type dopant is implanted in the substrate 102 to form the gate region 114 above the channel region 110. The P-type dopant may include B, Ga, Al, In, $BF3^+$, or a combination thereof.

Figure 4:
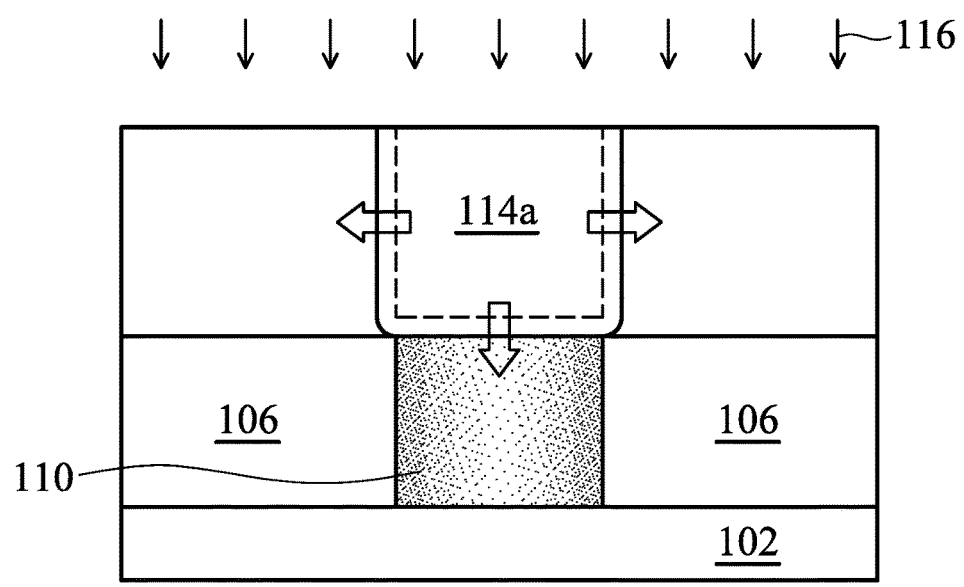

As shown in FIG. 4, a high-temperature annealing process 116 (temperature in a range of 1000° C. to 1100° C., time in a range of 8 hours to 12 hours) is performed after forming the P-type gate region 114, diffusing the dopant of the P-type gate region 114 diffuses and thereby forming the gate region 114a. After the annealing process 116, the abrupt PN junction around the gate region 114 is smoothed, and leakage current is reduced. After the annealing process 116, the dopant depth of the high-voltage well region 106 is in a range of around 8 µm to 12 µm.

Figure 5:
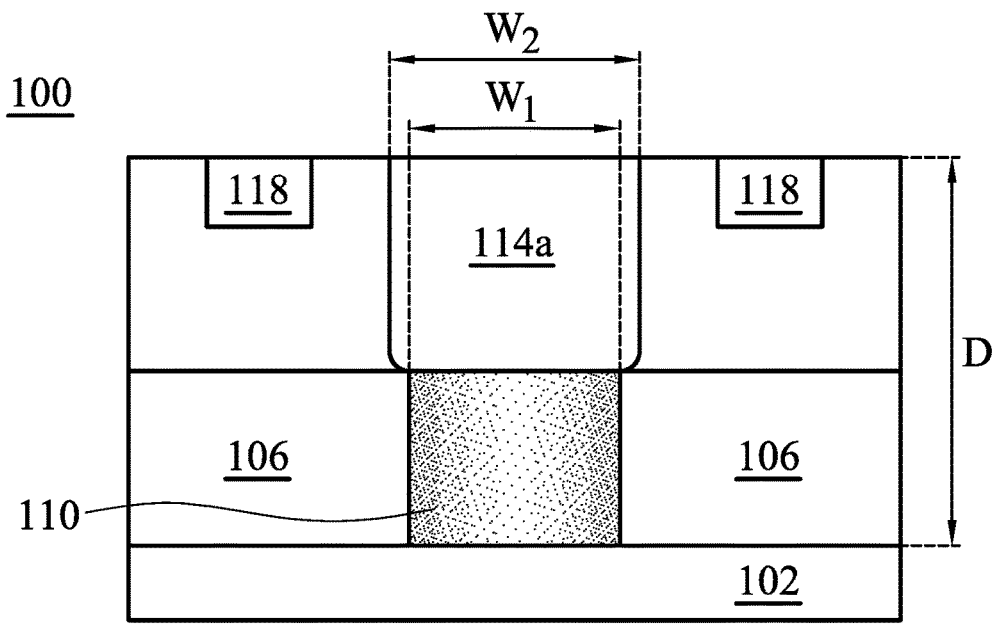

Next, as shown in FIG. 5, another implanting mask such as a patterned photoresist (not shown) is used to form N-type source/drain regions 118 on opposite sides of the gate region 114a by an ion implantation process in order to form the junction field effect transistor 100. The subsequent processes include forming the source/drain contacts, the interlayer dielectric layer, and the interconnected structures, etc. For the purpose of simplicity and clarity, they are not described in detail.

In the junction field effect transistor 100 as shown in FIG. 5, the dopant concentration of the channel region 110 is lower than the dopant concentration of the high-voltage well regions 106, and it decreases as distance increases away from the high-voltage well regions 106. Therefore, it is easier to form a depletion region in the channel region 110 to pinch off the current in the channel region 110, and the cut-off voltage of the junction field effect transistor 100 is lower, preventing the high-voltage device in the high-voltage process breakdown due to not being able to sustain the channel cut-off voltage. The cut-off voltage of the junction field effect transistor is in a range of 20V to 40V.

For the junction field effect transistor 100 as shown in FIG. 5, the width $W_1$ of the channel region 110 may be used as a parameter to modulate the channel cut-off voltage. If $W_1$ is wider, the dopant concentration of the channel region 110 is lighter, so it is easier for the channel to be pinched-off, and the channel cut-off voltage is lower. On the other hand, if $W_1$ is narrower, the dopant concentration of the channel region 110 is heavier, so it is harder for the channel to be pinched-off, and the channel cut-off voltage is higher.

However, the width $W_1$ of the channel region 110 is still restricted in a range of around 0.1 μm to two times the depth of the high-voltage well regions, such as from 4 μm to 20 μm. If the width $W_1$ of the channel region 110 is too narrow, it is limited by the photoresist limitation. To meet the requirements for critical dimensions and photoresist thickness at the same time, the photoresist pattern may easily collapse. If the width $W_1$ of the channel region 110 is too wide, after the annealing process 108, the N-type dopant of the high-voltage well region 106 will not be able to diffuse to the center of the channel region, resulting in there being no current in the channel region 110. However, those skilled in the art in this technical field should understand that the "photoresist limitation" depends on the technical capability. Therefore, $W_1$ may be narrower than 0.1 μm.

For the junction field effect transistor 100 shown in FIG. 5, the width $W_1$ of the channel region 110 may be the same as or different from the width $W_2$ of the gate region 114a, depending on the designed channel cut-off voltage. The ratio between $W_1$ and $W_2$ are in a range of 0.5 to 0.8. Compared to the width $W_1$ of the channel region 110, if the width $W_2$ of the gate region 114a is too narrow, the depletion region is too narrow and it is easy to induce leakage current. Compared to the width $W_1$ of the channel region 110, if the width $W_2$ of the gate region 114a is too wide, the channel region is too narrow so that there is no obvious effect of the present embodiment, since the channel cut-off voltage still depends on the high-voltage well regions 106.

As described above, in the present disclosure the channel region of the junction field effect transistor is formed by thermal diffusing the high-voltage well regions. Since the dopant concentration of the channel region is lower, it is easy to form a depletion region in the channel region, which can effectively reduce the channel cut-off voltage. Compared to the existing process, there is no need to add an extra photomask but the channel cut-off voltage may be modulated effectively.

In FIGS. 6 to 10, a method of fabricating a junction field effect transistor in some other embodiments of the present disclosure is shown. Some processes or devices are the same as, or similar to those used in the above-mentioned embodiments will use the same symbols and are not repeated in detail herein.

Figure 6:
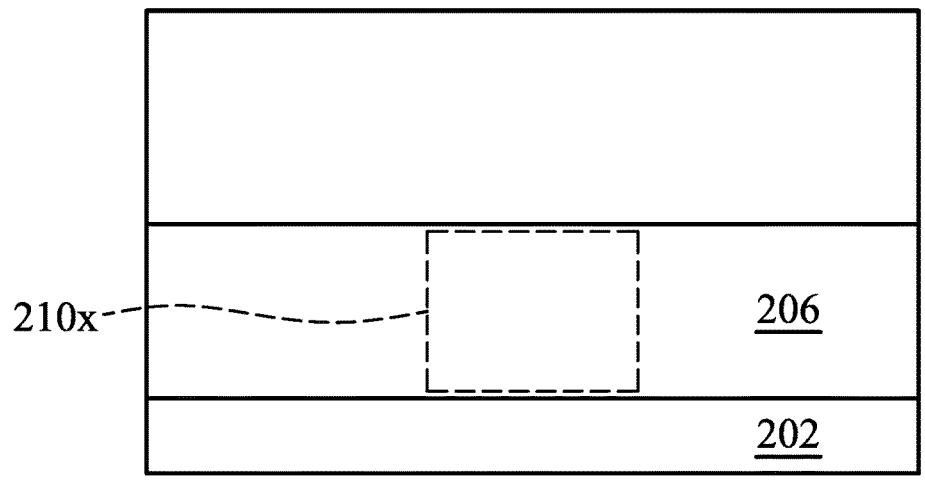
FIGS. 6-11 are cross-sectional representations of various stages of forming a junction field effect transistor in accordance with some other embodiments.

As shown in FIG. 6 according to some embodiments, the substrate 202 is provided. An N-type dopant is implanted in the substrate 202 to form an N-type high-voltage well region 206 by a patterned mask (not shown). Herein the channel predetermined region 210x is not protected by the patterned mask during the implantation, which is different from the above-mentioned embodiment. Therefore, the dopant concentration of the channel predetermined region 210x is substantially the same as that of the N-type high-voltage well region 206 at this moment. The dopant concentration of the N-type high-voltage well region 206 is in a range of around $10^{14}/cm^3$ to $10^{16}/cm^3$. The dopant energy is in a range of around 1000 keV to 3000 keV. The dopant depth is in a range of around 1 μm to 2.5 μm.

Figure 7:
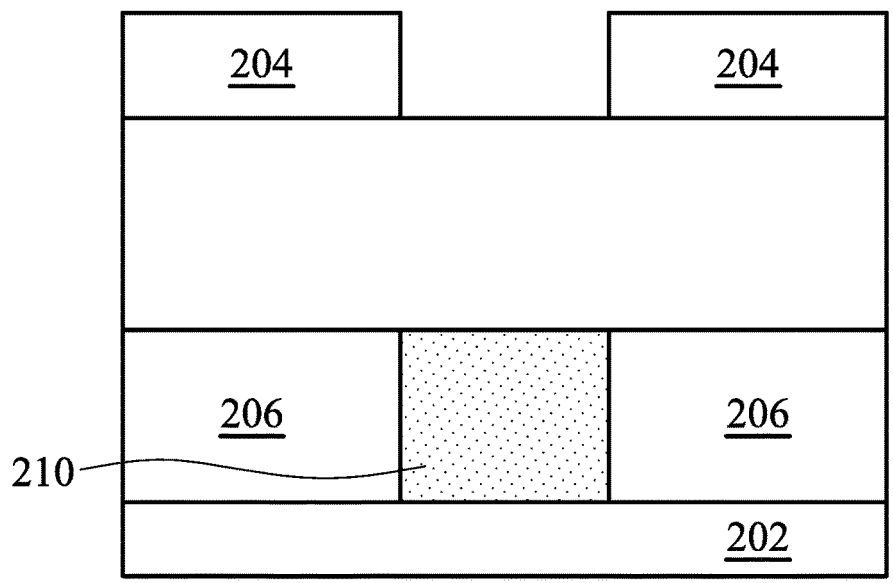

Next, as shown in FIG. 7 according to some embodiments, the channel region 210 is formed by an implantation process with a patterned mask (not shown) with a P-type counter-doping the channel predetermined region 210x to reduce the N-type effective dopant concentration in the channel predetermined region 210x. The dopant concentration of the P-type counter-doping is in a range of around $10^{14}/cm^3$ to $10^{16}/cm^3$. The dopant concentration of the counter-doping is lower than the dopant concentration of the N-type high-voltage well region 206, and the dopant depth of the counter-doping is substantially the same as that of the N-type high-voltage well region 206.

Figure 8:
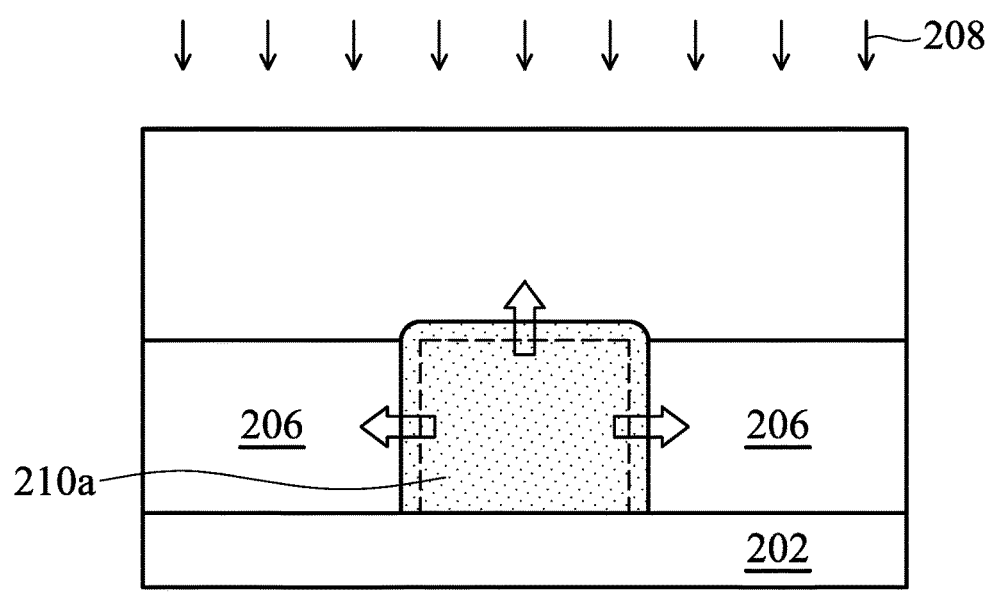

Next, as shown in FIG. 8 according to some embodiments, a high-temperature annealing process 208 is performed after the P-type counter-doping, making the P-type counter-dopant diffuse to form the channel region 210a. The annealing process 208 is performed at a temperature of around 1100° C. to 1200° C. for around 12 hours to 24 hours. The channel region 210a is N-type, and the depth of the channel region 210a is substantially the same as that of the high-voltage well region 206. The N-type dopant concentration of the channel region 210a is lower than that of the high-voltage well region 206, and the dopant concentration does not substantially change with distance from the high-voltage well region 206. The annealing process 208 may smooth the abrupt PN junction between the channel region 210 and the high-voltage well region 206, and leakage current is reduced.

Figure 9:
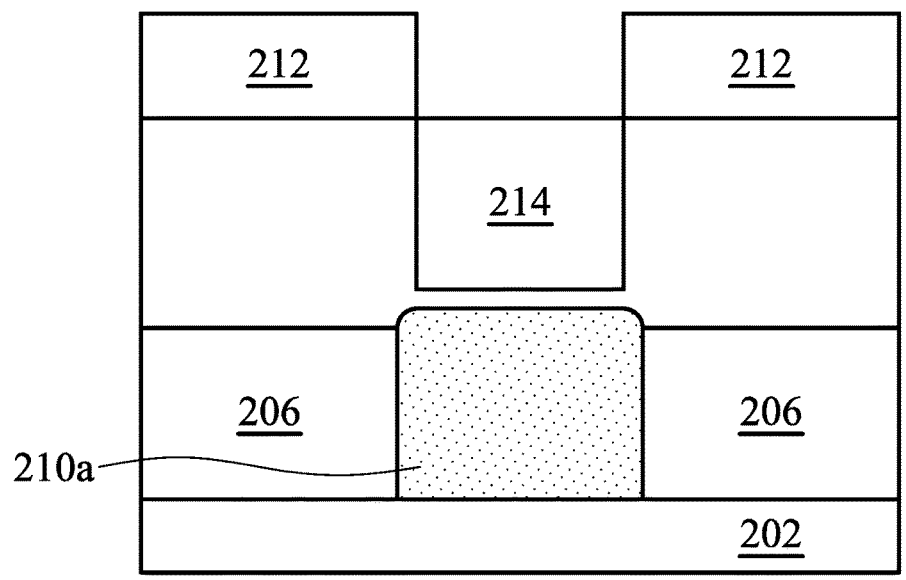

Next, as shown in FIG. 9 according to some embodiments, a photoresist 212 is formed on the substrate 202 by another patterned mask (now shown), and an implantation process is performed implanting a P-type dopant to form the gate region 214 above the channel region 210a.

Figure 10:
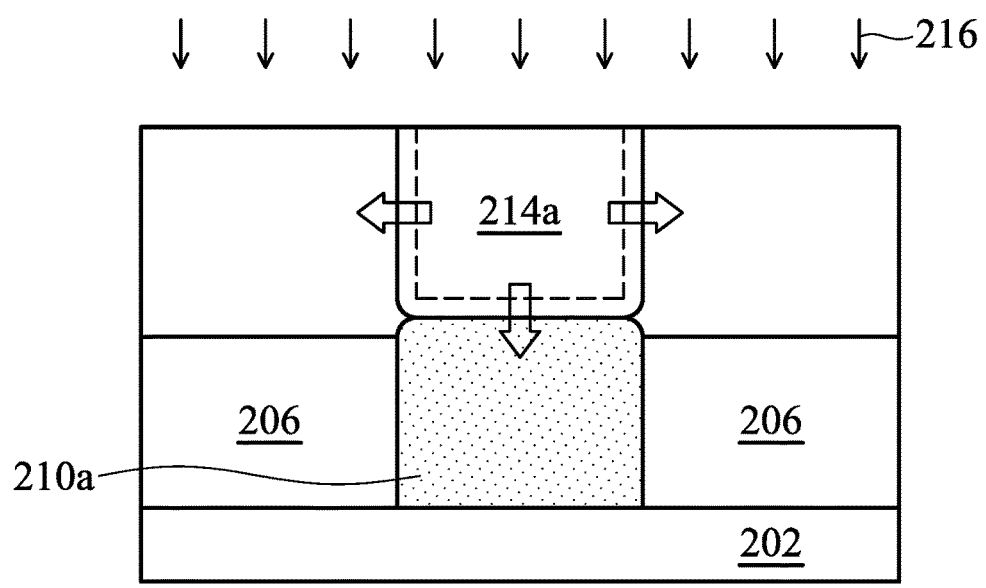

As shown in FIG. 10 according to some embodiments, a high-temperature annealing process 216 (temperature in a range of 1000° C. to 1100° C., time in a range of 8 hours to 12 hours) is performed after the formation of the P-type gate region 214, diffusing the dopant of the P-type gate region 214 to form the gate region 214a. After the annealing process 216, the abrupt PN junction around the gate region 214 is smoothed, and leakage current is reduced. After the annealing process, the dopant depth of the high-voltage well region 206 is in a range of around 8 μm to 12 μm.

Figure 11:
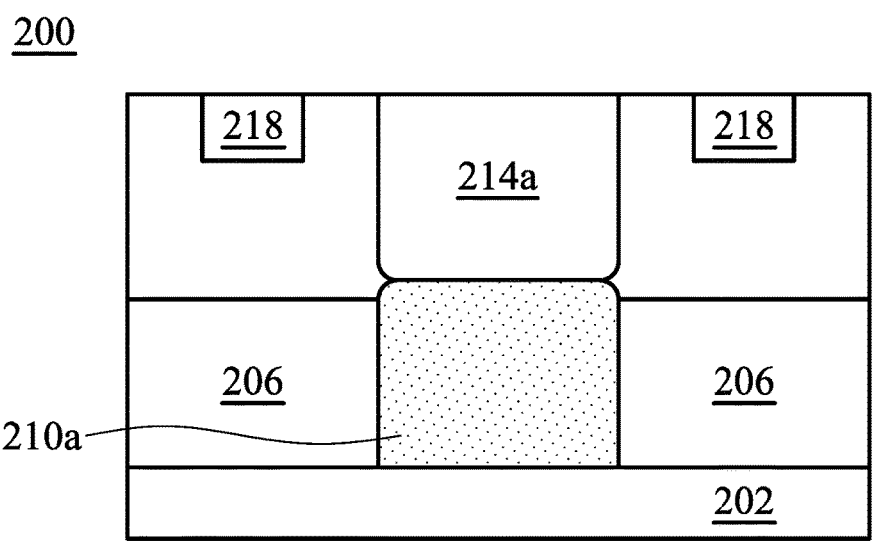

As shown in FIG. 11 according to some embodiments, the N-type source/drain regions 218 are formed on the opposite sides of the gate region 214a by an ion implantation process.

FIGS. 6 to 10 show a method of fabricating a junction field effect transistor 200 according to some embodiments. A counter-doping is performed in the channel region 210, making the net N-type dopant concentration of the channel region 210 is lower than the N-type dopant concentration of the high-voltage well region 206. Therefore, it is easier to form a depletion region in the channel region 210 to pinch off the current in the channel region 210, and the cut-off voltage of the junction field effect transistor 200 is lowered to prevent a breakdown of the high-voltage device in the high-voltage process due to it not being able to sustain the channel cut-off voltage.

Figure 12:
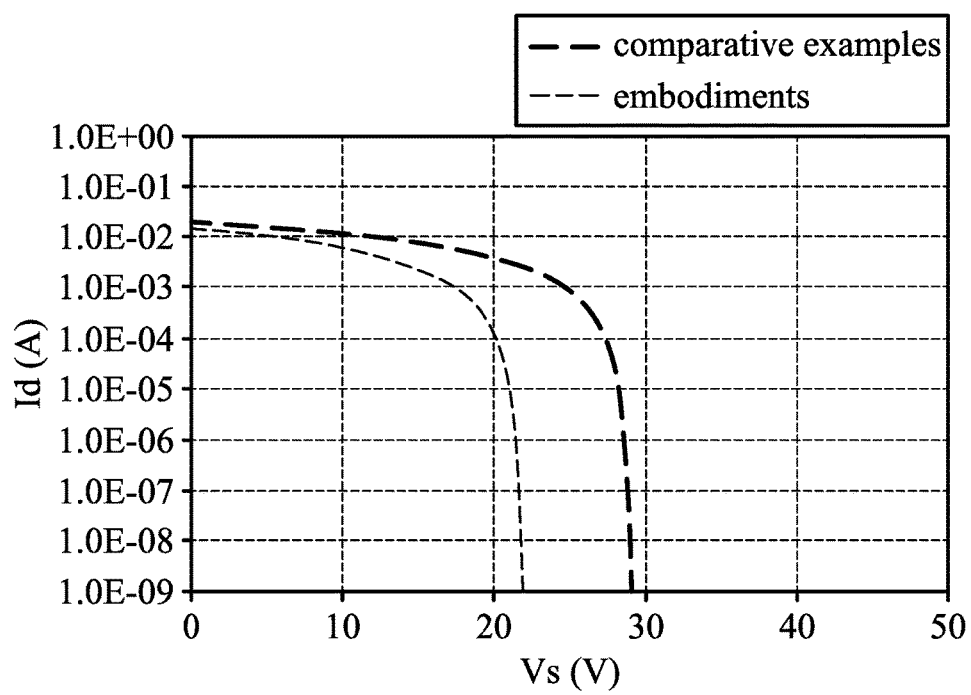
FIG. 12 is a drain current (Id)-source voltage (Vs) plot of junction field effect transistors in accordance with some other embodiments.

In FIG. 12, a test result of the drain current (Id)-source voltage (Vs) of a junction field effect transistor is shown. The difference between the comparative examples and the embodiments is that the dopant concentration of the channel region of the junction field effect transistor in the embodiments is lower than that in the comparative examples. Therefore, it is easier to form a depletion region in the channel region of the junction field effect transistor and the channel cut-off voltage is lower in the embodiments. As shown in FIG. 12, compared to the comparative example, in the embodiment of the present disclosure, the channel cut-off voltage may be modulated effectively, preventing the high-voltage device not being able to sustain the channel cut-off voltage.

To sum up, the embodiments of the present disclosure use thermal diffusing the dopant in the high-voltage well region or counter-doping to form junction field effect transistor with lower channel dopant concentration. Therefore, it is easier to form a depletion region in the channel region to pinch off the current in the channel region, and the cut-off voltage of the junction field effect transistor is lower to prevent the high-voltage device in the high-voltage process breakdown due to not being able to sustain the channel cut-off voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A junction field effect transistor (JFET), comprising:
a substrate;
a gate region disposed in the substrate and having a first conductive type;
source/drain regions disposed in the substrate on opposite sides of the gate region and having a second conductive type opposite to the first conductive type;
a pair of high-voltage well (HVW) regions disposed beneath the source/drain regions and having the second conductive type; and
a channel region disposed beneath the gate region and between the pair of high-voltage well regions;
wherein the channel region has the second conductive type, and a dopant concentration of the channel region is lower than a dopant concentration of the pair of high-voltage well regions.

2. The junction field effect transistor as claimed in claim 1, wherein the dopant concentration of the channel region decreases as distance increases away from the pair of high-voltage well regions.

3. The junction field effect transistor as claimed in claim 1, wherein a width of the channel region is in a range of 0.1 µm to two times a depth of the pair of high-voltage well regions.

4. The junction field effect transistor as claimed in claim 1, wherein a width of the gate region is equal to a width of the channel region.

5. The junction field effect transistor as claimed in claim 1, wherein a width of the gate region is different from a width of the channel region.

6. The junction field effect transistor as claimed in claim 1, wherein the gate region and the source/drain regions are configured to pinch off a current in the channel region such that a cut-off voltage of the junction field effect transistor is in a range of 20V to 40V.

* * * * *